US012698573B2

(12) United States Patent
Tanaka et al.

(10) Patent No.: US 12,698,573 B2
(45) Date of Patent: Aug. 4, 2026

(54) SiC EPITAXIAL WAFER AND METHOD FOR MANUFACTURING SiC EPITAXIAL WAFER

(71) Applicant: Resonac Corporation, Tokyo (JP)

(72) Inventors: Kensho Tanaka, Tokyo (JP); Rimpei Kindaichi, Tokyo (JP); Marie Ohuchi, Tokyo (JP)

(73) Assignee: Resonac Corporation, Tokyo (JP)

( * ) Notice: Subject to any disclaimer, the term of this patent is extended or adjusted under 35 U.S.C. 154(b) by 383 days.

(21) Appl. No.: 18/367,753

(22) Filed: Sep. 13, 2023

(65) Prior Publication Data

US 2024/0093405 A1 Mar. 21, 2024

(30) Foreign Application Priority Data

Sep. 15, 2022 (JP) ................................. 2022-147136

(51) Int. Cl.
*C30B 29/36* (2006.01)
*C30B 25/20* (2006.01)
(52) U.S. Cl.
CPC .............. *C30B 29/36* (2013.01); *C30B 25/20* (2013.01)
(58) Field of Classification Search
CPC ... C30B 25/20; C30B 29/36; H01L 21/02378; H01L 21/02529; H01L 21/0257; H01L 21/0262
See application file for complete search history.

(56) References Cited

U.S. PATENT DOCUMENTS

| | | | | |
|---|---|---|---|---|
| 10,121,865 | B2 * | 11/2018 | Hori ........................ | H10D 62/60 |
| 2012/0280254 | A1 * | 11/2012 | Muto ...................... | C30B 29/36 |
| | | | | 257/77 |
| 2017/0288025 | A1 * | 10/2017 | Hori ........................ | H10D 62/60 |
| 2018/0233562 | A1 * | 8/2018 | Nishiguchi .............. | C30B 25/20 |
| 2019/0177876 | A1 * | 6/2019 | Guo ..................... | H10P 14/2904 |
| 2024/0044045 | A1 * | 2/2024 | Crössmann ........... | C23C 16/545 |

FOREIGN PATENT DOCUMENTS

| | | |
|---|---|---|
| JP | 2017-84989 A | 5/2017 |
| JP | 6969628 B2 | 11/2021 |

* cited by examiner

*Primary Examiner* — Jaehwan Oh
(74) *Attorney, Agent, or Firm* — Sughrue Mion, PLLC

(57) ABSTRACT

A SiC epitaxial wafer according to the present embodiment includes: a SiC substrate; and a SiC epitaxial layer laminated on the SiC substrate, in which a carrier concentration uniformity of the SiC epitaxial layer is less than 3.8%, and the carrier concentration uniformity is a value obtained by dividing, by an average value, a difference between a maximum value and a minimum value of carrier concentrations of the SiC epitaxial layer measured along a straight line passing through a center of the SiC epitaxial layer when seen in a plan view.

11 Claims, 4 Drawing Sheets

SiC EPITAXIAL WAFER AND METHOD FOR MANUFACTURING SiC EPITAXIAL WAFER

BACKGROUND

Field

The present invention relates to a SiC epitaxial wafer and a method for manufacturing a SiC epitaxial wafer. Priority is claimed on Japanese Patent Application No. 2022-147136, filed Sep. 15, 2022, the content of which is incorporated herein by reference.

Description of Related Art

Compared to silicon (Si), silicon carbide (SiC) has a dielectric breakdown field as large as one order of magnitude and a bandgap three times as large. In addition, silicon carbide (SiC) has characteristics such as a high thermal conductivity that is about three times a thermal conductivity of silicon (Si). Therefore, silicon carbide (SiC) is expected to be applied to power devices, high-frequency devices, high-temperature operation devices, and the like. Accordingly, in recent years, SiC epitaxial wafers have come to be used for such semiconductor devices described above.

A SiC epitaxial wafer is obtained by laminating a SiC epitaxial layer on the surface of a SiC substrate. Hereinafter, a substrate before laminating a SiC epitaxial layer is referred to as a SiC substrate, and a substrate after laminating the SiC epitaxial layer is referred to as a SiC epitaxial wafer. The SiC substrate is cut out from a SiC ingot.

The carrier concentration of the SiC epitaxial wafer has an influence on the element characteristics of semiconductor devices. When the in-plane carrier concentration uniformity of the SiC epitaxial wafer is low, the element characteristics vary even if semiconductor devices are processed from the same SiC epitaxial wafer. SiC epitaxial wafers having a high in-plane carrier concentration uniformity are demanded to prevent variations in element characteristics and increase product yields.

For example, Patent Documents 1 and 2 disclose SiC epitaxial wafers having a high in-plane carrier concentration uniformity. For example, Patent Document 1 discloses that the in-plane carrier concentration uniformity of the SiC epitaxial wafer is enhanced by using ammonia gas as a carrier gas and reducing the flow rate of the gas. Furthermore, for example, Patent Document 2 discloses that the in-plane carrier concentration uniformity is enhanced by adjusting the temperature distribution of a silicon carbide substrate.

PATENT DOCUMENTS

[Patent Document 1] Japanese Patent No. 6969628
[Patent Document 2] Japanese Unexamined Patent Application, First Publication No. 2017-84989

SUMMARY

It is required to further enhance the in-plane carrier concentration uniformity of the SiC epitaxial wafer. The carrier concentration of the SiC epitaxial wafer is specifically high or low in the vicinity of a so-called edge exclusion region which is from the outermost circumference to about several millimeters inside, and the change tends to become more pronounced toward the outer circumference. It is required to further enhance the in-plane carrier concentration uniformity of the SiC epitaxial wafer by further reducing a specific change in the carrier concentration.

The present disclosure has been made in view of the above-mentioned problems, and an object thereof is to provide a SiC epitaxial wafer having a high in-plane carrier concentration uniformity, and a method for manufacturing a SiC epitaxial wafer.

The inventors of the present invention have found that the in-plane carrier concentration uniformity of a SiC epitaxial wafer can be further enhanced by increasing the growth rate of a SiC epitaxial layer and adjusting the in-plane temperature distribution of the SiC epitaxial layer. In order to achieve the above-mentioned object, the present invention provides the following means.

(1) A SiC epitaxial wafer according to a first aspect includes a SiC substrate and a SiC epitaxial layer laminated on the SiC substrate. A carrier concentration uniformity of the SiC epitaxial layer is less than 3.8%. The carrier concentration uniformity is a value obtained by dividing, by an average value, a difference between a maximum value and a minimum value of carrier concentrations of the SiC epitaxial layer measured along a straight line passing through a center of the SiC epitaxial layer when seen in a plan view.

(2) In the SiC epitaxial wafer according to the above-mentioned aspect, a diameter of the SiC substrate may be 149 mm or more.

(3) In the SiC epitaxial wafer according to the above-mentioned aspect, a diameter of the SiC substrate may be 199 mm or more.

(4) A method for manufacturing a SiC epitaxial wafer according to a second aspect includes a film formation step of forming a SiC epitaxial layer on one surface of a SiC substrate. A growth rate of the SiC epitaxial layer is 61 μm/h or more. A temperature difference between a film formation temperature for an inner region of the SiC epitaxial layer in the film formation step and an average temperature in the inner region is lower than ±1° C. A film formation temperature for an outer region of the SiC epitaxial layer in the film formation step is lower than a temperature of an outermost circumference of the inner region by equal to or higher than 2° C. and lower than 10° C. The inner region is a region on an inner side of a concentric circle having a center position coinciding with a center of the SiC substrate and having a diameter that is 80% of a diameter of the SiC substrate. The outer region is a region on an outer side of the inner region.

(5) In the method for manufacturing a SiC epitaxial wafer according to the above-mentioned aspect, the diameter of the SiC substrate may be 149 mm or more.

(6) In the method for manufacturing a SiC epitaxial wafer according to the above-mentioned aspect, the diameter of the SiC substrate may be 199 mm or more.

The SiC epitaxial wafer according to the above-mentioned aspect has a high in-plane carrier concentration uniformity. Furthermore, by using the method of a SiC epitaxial wafer according to the above-mentioned aspect, a SiC epitaxial wafer having a high in-plane carrier concentration uniformity can be obtained.

DETAILED DESCRIPTION

Figure 1:
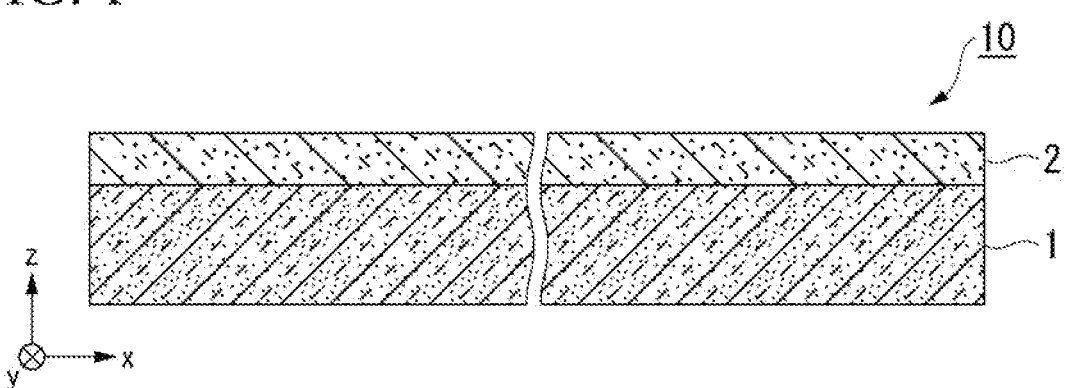
FIG. 1 is a cross-sectional view of a SiC epitaxial wafer according to the present embodiment.

Hereinafter, a SiC substrate and the like according to the present embodiment will be described in detail with appropriate reference to the drawings. In the drawings used in the following description, characteristic portions may be shown by enlarging them for convenience to facilitate understanding characteristics of the present embodiment, and the dimensional ratios and the like of each of constituent elements may be different from those of actual constituent elements. Materials, dimensions, and the like exemplified in the following description are examples, and the present invention is not limited thereto and can be implemented with appropriate changes in a range not departing from the scope thereof.

First, directions will be defined. One direction in a plane in which a SiC substrate spreads is defined as an x-direction, and a direction orthogonal to the x-direction in the same plane is defined as a y-direction. The x-direction is an <11-20> direction, for example. The y-direction is a <1-100> direction, for example. A z-direction is a direction perpendicular to the SiC substrate and orthogonal to the x-direction and the y-direction.

"SiC Epitaxial Wafer"

Figure 2:
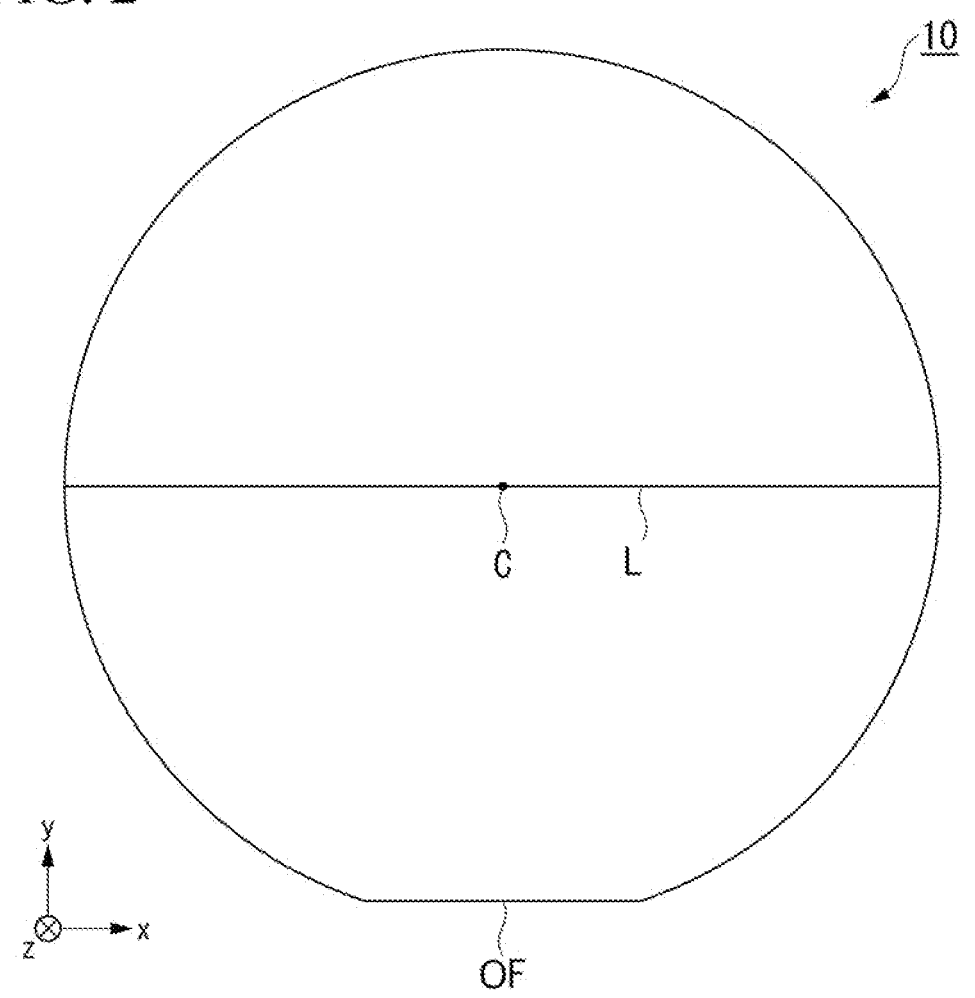
FIG. 2 is a plan view of the SiC epitaxial wafer according to the present embodiment.

FIG. 1 is a cross-sectional view of a SiC epitaxial wafer 10 according to the present embodiment. The SiC epitaxial wafer 10 has a SiC substrate 1 and a SiC epitaxial layer 2. FIG. 2 is a plan view of the SiC epitaxial wafer 10 according to the present embodiment. FIG. 2 is a view of the surface of the SiC epitaxial layer 2 side of the SiC epitaxial wafer 10 when seen in a plan view from the z-direction.

The SiC substrate 1 is n-type SiC, for example. The polytype of the SiC substrate 1 is not particularly limited and may be any of 2H, 3C, 4H, and 6H. The SiC substrate 1 is 4H—SiC, for example.

The shape of the SiC substrate 1 when seen in a plan view is substantially circular. The SiC substrate 1 may have an orientation flat OF or a notch for ascertaining the direction of a crystal axis. The diameter of the SiC substrate 1 is not particularly limited. The diameter of the SiC substrate 1 is 149 mm or more and 151 mm or less, for example. For example, the diameter of the SiC substrate 1 may be 199 mm or more and 201 mm or less, may be 249 mm or more and 251 mm or less, or may be 299 mm or more and 301 mm or less. For example, the diameter of the SiC substrate 1 may be 149 mm or more, may be 199 mm or more, may be 249 mm or more, or may be 299 mm or more.

The SiC epitaxial layer 2 is SiC doped with impurities. The SiC epitaxial layer 2 contains nitrogen as an impurity that determines the conductivity type, for example. The SiC epitaxial layer 2 may contain impurities such as boron in addition to nitrogen. The SiC epitaxial layer 2 is n-type SiC, for example.

The average value of the carrier concentration of the SiC epitaxial layer 2 is $1.0 \times 10^{14}$ cm$^{-3}$ or more and $9.0 \times 10^{16}$ cm$^{-3}$ or less, and is preferably $1.0 \times 10^{14}$ cm$^{-3}$ or more and $9.0 \times 10^{15}$ cm$^{-3}$, for example. The carrier concentration is an effective carrier concentration. The effective carrier concentration is an absolute value of the difference between a donor concentration and an acceptor concentration.

The carrier concentration of the SiC epitaxial layer 2 can be measured by a mercury probe (Hg—CV) method or a secondary ion mass spectrometry (SIMS) method, for example. The Hg—CV method measures the difference between a donor concentration and an acceptor concentration as the effective carrier concentration. The secondary ion mass spectrometry (SIMS) is a method of performing mass spectrometry on ejected secondary ions while scraping a layer in a thickness direction. A doping concentration can be measured from the mass spectrometry.

The carrier concentration of the SiC epitaxial layer 2 is measured along a straight line L passing through a center C of the SiC epitaxial layer 2 when seen in a plan view, for example. The straight line L is a line extending in the <11-20> direction, for example. The straight line L may be a line extending in the <1-100> direction. Furthermore, there may be a plurality of the straight lines L. For example, the carrier concentration of the SiC epitaxial layer 2 may be measured along a line extending in a cross direction with the center C as the origin. Furthermore, because the vicinity of the outermost circumference of the SiC epitaxial wafer 10 is outside a device acquisition region, positions less than 5 mm from the outermost circumference are not included in the measurement points. The outermost circumference of the SiC epitaxial wafer 10 is an outermost circumference of the entire wafer including a bevel part (inclined part at an outer circumference edge). The carrier concentration may be measured on the straight line L at equal intervals from the center C, and the intervals may vary. The carrier concentration may be measured at 10 mm intervals, may be measured at 15 mm intervals, may be measured at 20 mm intervals, may be measured at 25 mm intervals, or may be measured at 30 mm intervals.

The carrier concentration uniformity of the SiC epitaxial layer 2 is less than 3.8%. The carrier concentration uniformity of the SiC epitaxial layer 2 is preferably 3.0% or less. The carrier concentration uniformity of the SiC epitaxial layer 2 is more preferably 1.0% or less. The carrier concentration uniformity is obtained by dividing, by an average value, the difference between a maximum value and a minimum value of the carrier concentrations of the SiC epitaxial layer 2 measured along the straight line L passing through the center C of the SiC epitaxial layer 2 when seen in a plan view from the z-direction.

As an example, when the diameter of the SiC substrate 1 is 150 mm (6 inches), the carrier concentration is measured at the center and at each position of ±15 mm, ±30 mm, ±45 mm, ±60 mm, and ±70 mm from the center along the straight line L extending in the <11-20> direction with the center C as a reference, and the carrier concentration uniformity is obtained from each carrier concentration at these measurement points.

Furthermore, for example, when the diameter of the SiC substrate 1 is 200 mm (8 inches), the carrier concentration is measured at the center and at each position of t 20 mm, ±40 mm, ±60 mm, ±80 mm, and ±95 mm from the center along the straight line L extending in the <11-20> direction with the center C as a reference, and the carrier concentration uniformity is obtained from each carrier concentration at these measurement points.

Furthermore, for example, when the diameter of the SiC substrate 1 is 250 mm (10 inches), the carrier concentration is measured at the center and at each position of ±25 mm, ±50 mm, ±75 mm, ±100 mm, and ±120 mm from the center along the straight line L extending in the <11-20> direction with the center C as a reference, and the carrier concentration uniformity is obtained from each carrier concentration at these measurement points.

Furthermore, for example, when the diameter of the SiC substrate 1 is 300 mm (12 inches), the carrier concentration is measured at the center and at each position of ±30 mm, t 60 mm, t 90 mm, t 120 mm, and t 145 mm from the center along the straight line L extending in the <11-20> direction with the center C as a reference, and the carrier concentration uniformity is obtained from each carrier concentration at these measurement points.

In the SiC epitaxial wafer 10 according to the present embodiment, the carrier concentration uniformity of the SiC epitaxial layer 2 is less than 3.8%. The closer the value of the carrier concentration uniformity is to zero, the higher the carrier concentration uniformity in the in-plane direction. SiC devices cut out from the SiC epitaxial wafer 10 according to the present embodiment have small variations in carrier concentration and small variations in element characteristics.

Furthermore, because the SiC epitaxial wafer 10 according to the present embodiment has a small variation in in-plane carrier concentration, a part of a reliability test can be omitted. When the variation in in-plane carrier concentration is large, it is required to perform the reliability test on a plurality of in-plane points of the SiC epitaxial wafer 10. On the other hand, when the variation in in-plane carrier concentration is small, the reliability test may be performed on one representative point. For example, even when the reliability test is performed at three points (for example, the center, half the radius, and 5 mm inside the radius) in a case where the carrier concentration uniformity of the SiC epitaxial layer 2 is 3.8% or more, the reliability test may be performed at two points (for example, the center and 5 mm inside the radius) when the carrier concentration uniformity of the SiC epitaxial layer 2 is 3.0% or less, and the reliability test may be performed at one point (for example, the center) when the carrier concentration uniformity is 1.0% or less. There are various items in the reliability test. When a plurality of test items are measured at each measurement point, this takes time and costs accordingly. In contrast, the SiC epitaxial wafer 10 according to the present embodiment can omit a part of the reliability test, resulting in low cost.

"Method for Manufacturing SiC Epitaxial Wafer"

A method for manufacturing a SiC epitaxial wafer includes a preparation step for the SiC substrate 1 and a film formation step for the SiC epitaxial layer 2.

First, the SiC substrate 1 is prepared. The SiC substrate 1 is obtained by slicing a SiC ingot into a predetermined thickness. For example, the SiC ingot is sliced such that the main surface of the SiC substrate 1 has an offset angle of 0.4° or more and 5° or less with respect to a (0001) plane. The SiC ingot is produced by a sublimation method, for example. The SiC substrate 1 may be purchased from the market. The diameter of the SiC substrate 1 is not particularly limited. The diameter of the SiC substrate 1 is 149 mm or more and 151 mm or less, for example. For example, the diameter of the SiC substrate 1 may be 199 mm or more and 201 mm or less, may be 249 mm or more and 251 mm or less, or may be 299 mm or more and 301 mm or less. For example, the diameter of the SiC substrate 1 may be 149 mm or more, may be 199 mm or more, may be 249 mm or more, or may be 299 mm or more.

Subsequently, the film formation step of forming the SiC epitaxial layer 2 on the SiC substrate 1 is performed. The SiC epitaxial layer 2 is formed by a CVD method, for example.

Figure 3:
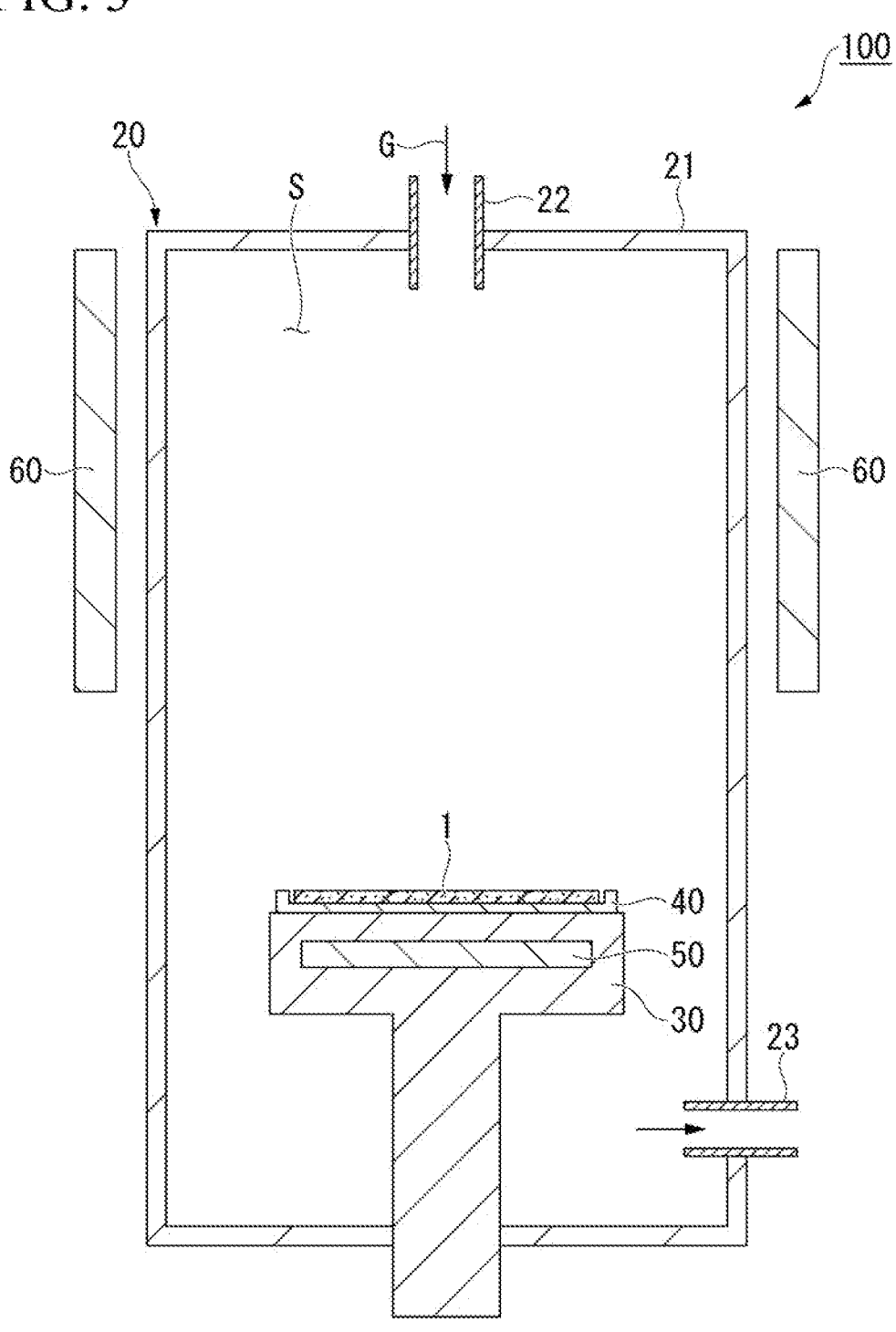
FIG. 3 is a schematic view of an example of a film formation apparatus for the SiC epitaxial wafer according to the present embodiment.

FIG. 3 is a schematic view of an example of a film formation apparatus 100 for the SiC epitaxial wafer 10 according to the first embodiment. The film formation apparatus 100 has a chamber 20, a support 30, a susceptor 40, a lower heater 50, and an upper heater 60, for example. FIG. 3 shows a state in which the SiC substrate 1 is mounted on the susceptor 40. The film formation apparatus 100 is a vertical furnace having a gas supply port 22 above the mounting surface of the SiC substrate 1.

The chamber 20 has a main body 21, a gas supply port 22, and a gas discharge port 23, for example. The main body 21 surrounds a film formation space S. The gas supply port 22 is an inlet for supplying a film formation gas G to the film formation space S. The gas supply port 22 is above the mounting surface of the SiC substrate 1, for example. The gas discharge port 23 is an outlet through which the film formation gas G and the like that have stayed in the film formation space S are discharged. The gas discharge port 23 is below the mounting surface of the SiC substrate 1, for example. The film formation gas G is a Si-based gas, a C-based gas, a purge gas, or a dopant gas, for example.

The Si-based gas is a raw material gas containing Si in its molecule. Examples of the Si-based gas include silane ($SiH_4$), dichlorosilane ($SiH_2Cl_2$), trichlorosilane ($SiHCl_3$), and tetrachlorosilane ($SiCl_4$). Examples of the C-based gas include propane ($C_3H_8$) and ethylene ($C_2H_4$). The dopant gas is a gas containing an element that serves as a carrier. Examples of the dopant gas include nitrogen and ammonia. The purge gas is a gas that transports these gases to the SiC substrate 1, and is hydrogen or the like that is inert to SiC.

The support 30 supports the SiC substrate 1. The support 30 is rotatable around its axis. The SiC substrate 1 is mounted on the support 30 while the SiC substrate 1 is in the state of being mounted on the susceptor 40, for example. The susceptor 40 is transported into the chamber 20 in the state in which the SiC substrate 1 mounted on the susceptor 40. The lower heater 50 is inside the support 30 and heats the SiC substrate 1, for example. The upper heater 60 heats the upper part of the chamber 20. For example, a member exposed in the film formation space S may be a carbon member, and has a surface that may be coated with SiC or TaC. The film formation step is performed in a vertical furnace shown in FIG. 3, for example.

Figure 4:
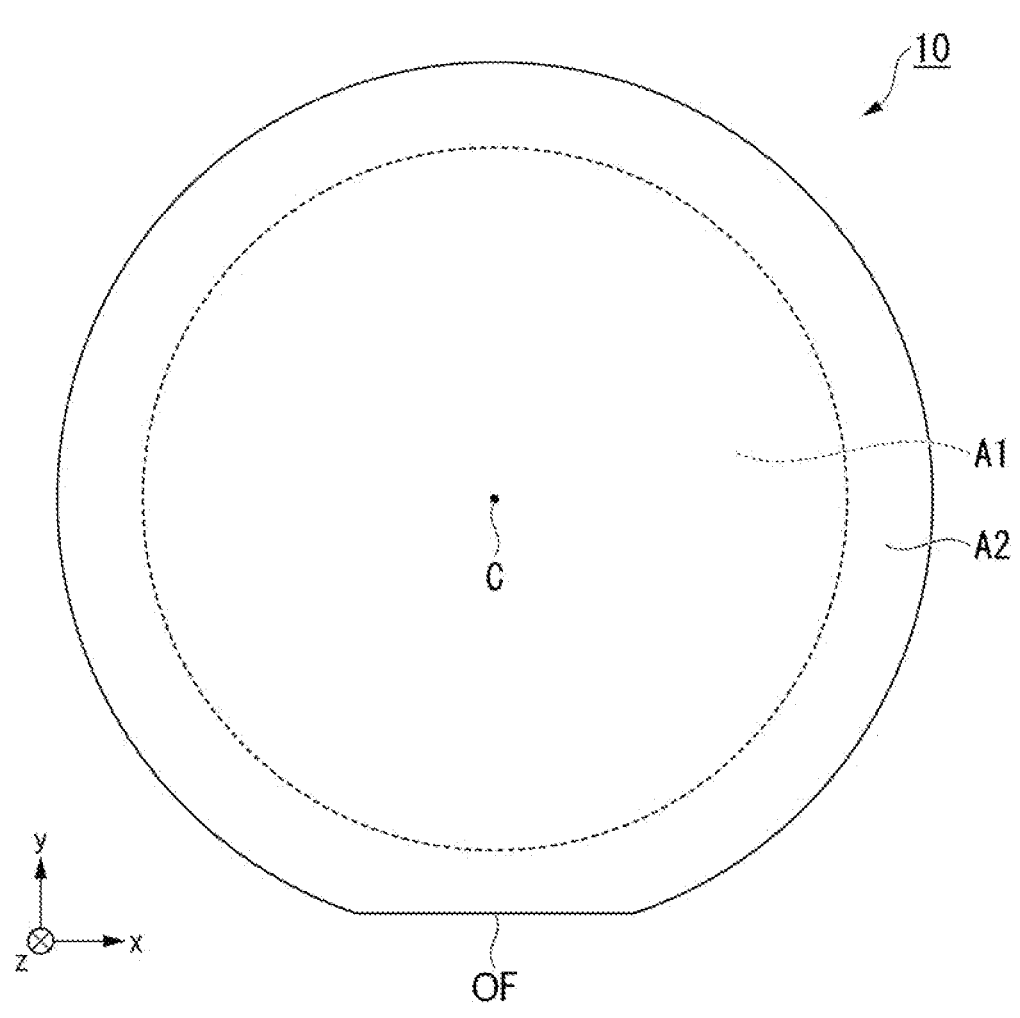
FIG. 4 is a schematic view for explaining a film formation step for a SiC epitaxial layer according to the present embodiment.

In the film formation step, the film formation temperature of the SiC epitaxial layer 2 is controlled. The film formation temperature controls each of an inner region A1 and an outer region A2 of the SiC epitaxial layer 2. FIG. 4 is a schematic view for explaining the film formation step for the SiC epitaxial layer 2 according to the present embodiment.

The inner region A1 is a region on the inner side of a concentric circle having a center position coinciding with the center of the SiC substrate 1 and having a diameter that is 80% of the diameter of the SiC substrate 1. For example, when the SiC substrate 1 has a diameter of 150 mm (6 inches), the region on the inner side of the concentric circle having a radius of 60 mm is the inner region A1. For example, when the SiC substrate 1 has a diameter of 200 mm (8 inches), the region on the inner side of the concentric circle having a radius of 80 mm is the inner region A1. For example, when the SiC substrate 1 has a diameter of 250 mm (10 inches), the region on the inner side of the concentric circle having a radius of 100 mm is the inner region A1. For example, when the SiC substrate 1 has a diameter of 300 mm (12 inches), the region on the inner side of the concentric circle having a radius of 120 mm is the inner region A1. The outer region A2 is a region positioned on the outer side of the inner region A1.

In the film formation step, the film formation temperature of the inner region A1 is controlled such that the temperature difference with the average temperature in the inner region A1 is lower than t 1° C. The film formation temperature of the inner region A1 can be controlled by adjusting the output of the lower heater 50, for example. In addition, the film formation temperature of the inner region A1 may be adjusted by adjusting the structure of the susceptor, the emissivity, and the like. Alternatively, the film formation temperature of the inner region A1 may be adjusted by adjusting the output of the upper heater 60.

In the film formation step, the film formation temperature of the outer region A2 is controlled to be lower than the temperature of the outermost circumference of the inner region A1 by equal to or higher than 2° C. and lower than 10° C. In other words, the film formation temperature of the outer region A2 is controlled to be lower than the temperature of the outermost circumference of the inner region A1 by 2° C. or higher and by lower than 10° C. For example, the temperature of the outermost circumference of the inner region A1 is an average value of the film formation temperatures at several measurement points on the outermost circumference of the inner region A1. The film formation temperature of the outer region A2 can be adjusted in the same manner as the film formation temperature of the inner region A1.

The film formation temperature in the film formation step can be measured with a radiation-type thermometer, for example. Alternatively, the film formation temperature in the film formation step may be obtained using simulation results by a computer.

In the film formation step, the growth rate of the SiC epitaxial layer 2 is also controlled. The growth rate of the SiC epitaxial layer 2 is set to 61 μm/h or more. The growth rate of the SiC epitaxial layer 2 can be changed by adjusting the supply amount of raw material gases (Si-based gas and C-based gas), the temperature of the susceptor 40, and the like. The growth rate of the SiC epitaxial layer 2 can be calculated from a difference in wafer thickness before and after film formation and from a film formation time, for example.

By increasing the growth rate of the SiC epitaxial layer 2, an element such as boron, which is different from the element that determines the conductivity type, can be prevented from being incorporated into the SiC epitaxial layer 2 as an impurity. For example, boron and aluminum can each be $1.0 \times 10^4$ cm$^{-3}$ or less at all measurement points as in the case of the carrier concentration. Furthermore, the incorporation amount of the element such as boron, which is different from the element that determines the conductivity type, as an impurity can be controlled by making the temperature difference in the inner region small as ±1° C. and making the outer region lower than the inner region by equal to or more than 2° C. and lower than 10° C. to control the convection over the entire surface of the wafer. For example, boron and aluminum can each be $1.0 \times 10^{13}$ cm$^{-3}$ or more and $1.0 \times 10^{14}$ cm$^{-3}$ or less at all measurement points as in the case of the carrier concentration. These elements are elements supplied from the chamber 20, and when incorporated into the SiC epitaxial layer 2, the effective carrier concentration fluctuates. The fluctuation of the effective carrier concentration can be prevented by preventing the incorporation of an element different from the element that determines the conductivity type into the SiC epitaxial layer 2. For example, in a case where the average value of the carrier concentration of the SiC epitaxial layer 2 is $1.0 \times 10^{16}$ cm$^{-3}$, when boron and aluminum are $1.0 \times 10^{13}$ cm$^{-3}$ or more and $1.0 \times 10^{14}$ cm$^{-3}$ or less, the fluctuation of the performance carrier concentration is 0.1% or more and 1% or less, which is a small influence on the effective carrier concentration. In addition, a carrier lifetime tends to become longer as the content of the element such as boron, which is different from the element that determines the conductivity type, in the SiC epitaxial layer 2 decreases. Meanwhile, when the carrier lifetime is too long, bipolar devices may have poor switching characteristics, which increases switching loss. By controlling boron and aluminum to $1.0 \times 10^{13}$ cm$^{-3}$ or more and $1.0 \times 10^{14}$ cm$^{-3}$ or less at all measurement points as in the case of the carrier concentration, the carrier lifetime in the device can be further stabilized.

In addition, in the film formation step, the gas flow rate supplied to the SiC epitaxial layer 2 is controlled. A gas for controlling the gas flow rate is a Si-based gas, a C-based gas, a purge gas, or a dopant gas, for example. By controlling the gas flow rate, variations in carrier concentration in the SiC epitaxial layer 2 can be reduced.

The method for manufacturing a SiC epitaxial wafer according to the present embodiment can reduce variations in in-plane carrier concentration of the SiC epitaxial wafer 10 by adjusting the film formation temperature and the growth rate of the SiC epitaxial layer 2. As described above, the SiC epitaxial wafer 10 having a small variation in in-plane carrier concentration can omit the reliability test, and thus can be suitably used as a substrate for high-withstand-voltage semiconductor devices used as power sources for various devices.

Although the preferable embodiments of the present invention have been described in detail above, the present invention is not limited to specific embodiments, and various modifications and changes are possible within the scope of the gist of the present invention described in the scope of the claims.

EXAMPLES

Example 1

The SiC substrate 1 having a diameter of 150 mm was prepared. The SiC epitaxial layer 2 was formed on the SiC substrate 1 using a vertical furnace similar to the film formation apparatus 100 shown in FIG. 3. Then, the thickness of the SiC epitaxial layer 2 after film formation was measured with an infrared spectrophotometer. The thickness of the SiC epitaxial layer 2 after film formation was measured at each of six points of 0 mm, 15 mm, 30 mm, 45 mm, 60 mm, and 70 mm in a <1-100> direction with the center C of the SiC epitaxial wafer 10 as a reference. The growth rate of the SiC epitaxial layer 2 obtained by dividing the average thickness of the above-mentioned six points by a film formation time was 61 μm/h or more.

In addition, the film formation temperatures of the inner region A1 and the outer region A2 in the film formation step were obtained by simulation using a computer. The temperature at each position of the SiC epitaxial wafer 10 obtained by simulation substantially matched the temperature actually measured using a radiation-type thermometer. The film formation temperature was obtained at intervals of 1 mm in the <1-100> direction with the center C of the SiC epitaxial wafer 10 as a reference. The film formation temperature at each measurement point in the inner region A1 was lower than t 1° C. with respect to the average temperature at these measurement points. In addition, the film formation temperature of the outer region A2 at the time of film formation was lower than the temperature of the outermost circumference of the inner region A1 by 3.3° C. The film formation temperature of the outer region A2 was the temperature at a position 70 mm away from the center C in the <1-100> direction. The temperature of the outermost circumference of the inner region A1 was the temperature at a position 60 mm away from the center C in the <1-100> direction.

Then, the carrier concentration of the SiC epitaxial layer 2 after film formation was measured. The carrier concentration was measured at each of six points of 0 mm, 15 mm, 30 mm, 45 mm, 60 mm, and 70 mm in the <1-100> direction with the center C of the SiC epitaxial wafer 10 as a reference. The carrier concentration uniformity was obtained by dividing the difference between the maximum value and the minimum value of the carrier concentration at the measurement points by the average value. The carrier concentration uniformity of the SiC epitaxial wafer 10 of Example 1 was 2.4%.

Comparative Example 1

Comparative Example 1 differs from Example 1 in that the growth rate of the SiC epitaxial layer 2 was less than 61 μm/h. In addition, in Comparative Example 1, the film formation temperature of the outer region A2 at the time of film formation was lower than the temperature of the outermost circumference of the inner region A1 by 2.9° C. The carrier concentration uniformity of the SiC epitaxial wafer 10 of Comparative Example 1 was obtained with the other conditions of Comparative Example 1 being the same as those of Example 1. The carrier concentration uniformity of the SiC epitaxial wafer 10 of Comparative Example 1 was 5.0%.

Comparative Example 2

Comparative Example 2 differs from Example 1 in that the film formation temperature of the outer region A2 was changed. In Comparative Example 2, the film formation temperature of the outer region A2 at the time of film formation was lower than the temperature of the outermost circumference of the inner region A1 by 1.97° C. The carrier concentration uniformity of the SiC epitaxial wafer 10 of Comparative Example 2 was obtained with the other conditions of Comparative Example 2 being the same as those of Example 1. The carrier concentration uniformity of the SiC epitaxial wafer 10 of Comparative Example 2 was 12.9%.

The results of Example 1, Comparative Example 1, and Comparative Example 2 are summarized in Table 1 below. The column of Inner region in Table 1 is the temperature difference at each measurement point with respect to the average temperature in the inner region. The column of Outer region in Table 1 is the temperature difference with the temperature of the outermost circumference of the inner region as a reference.

TABLE 1

| | | Film formation temperature | | Carrier concentration uniformity |
|---|---|---|---|---|
| | Growth rate | Inner region | Outer region | (%) |
| Example 1 | 61 μm/h or more | Lower than ±1° C. | −3.3° C. | 2.4 |
| Comparative | Less than | Lower than | −2.9° C. | 5.0 |

TABLE 1-continued

| | | Film formation temperature | | Carrier concentration uniformity |
|---|---|---|---|---|
| | Growth rate | Inner region | Outer region | (%) |
| Example 1 | 61 μm/h | ±1° C. | | |
| Comparative Example 2 | 61 μm/h or more | Lower than ±1° C. | −1.97° C. | 12.9 |

Example 1, in which the growth rate and the film formation temperature were controlled, had a lower carrier concentration uniformity value and a smaller in-plane variation in carrier concentration than Comparative Examples 1 and 2. In Comparative Example 1, it is thought that in-plane carrier concentrations varied because the growth rate was slow, and elements such as boron, which are other than the element that determines the conductivity type, were incorporated into the vicinity of the outermost circumference. In Comparative Example 2, it is thought that in-plane carrier concentrations varied because the film formation temperature difference between the inner region and the outer region was equal to or less than a predetermined value.

Example 2

Figure 5:
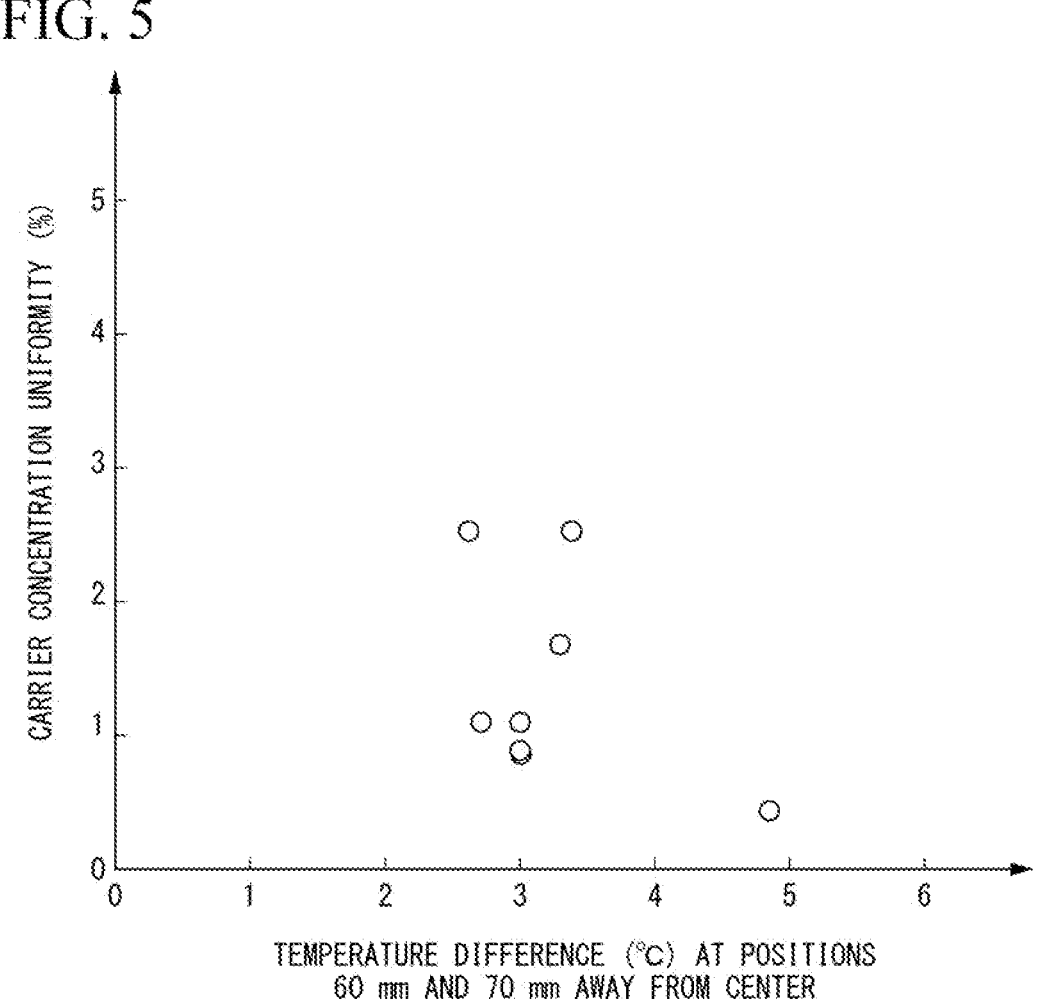
FIG. 5 is a graph showing measurement results of Example 2.

Example 2 differs from Example 1 in that the temperature of the outer region with respect to the temperature of the outermost circumference of the inner region was changed. In Example 2, the film formation temperature of the outer region in the film formation step was set to be lower than the temperature of the outermost circumference of the inner region by equal to or higher than 2° C. and lower than 10° C. The measurement results of Examples 1 and 2 are summarized in FIG. 5.

As shown in Example 2, it was confirmed that the value of the carrier concentration uniformity can be lowered when the growth rate is equal to or more than a predetermined value and when the temperature difference between the inner region and the outer region is equal to or higher than a predetermined value.

EXPLANATION OF REFERENCES

1 SiC substrate
2 SiC epitaxial layer
10 SiC epitaxial wafer
C Center
L Straight line
20 Chamber
21 Main body
22 Gas supply port
23 Gas discharge port
30 Support
40 Susceptor
50 Lower heater
60 Upper heater
100 Film formation apparatus
A1 Inner region
A2 Outer region

What is claimed is:
1. A SiC epitaxial wafer comprising:
a SiC substrate; and
a SiC epitaxial layer laminated on the SiC substrate,
wherein a carrier concentration uniformity of the SiC epitaxial layer is less than 3.8%, the carrier concentration uniformity is a value obtained by dividing, by an average value, a difference between a maximum value and a minimum value of carrier concentrations of the SiC epitaxial layer measured along a straight line passing through a center of the SiC epitaxial layer when seen in a plan view, and the measurement points for the carrier concentration of the SiC epitaxial layer when determining the carrier concentration uniformity include points 5 mm from the outer periphery.

2. The SiC epitaxial wafer according to claim 1, wherein a diameter of the SiC substrate is 149 mm or more.

3. The SiC epitaxial wafer according to claim 1, wherein a diameter of the SiC substrate is 199 mm or more.

4. A method for manufacturing a SiC epitaxial wafer, the method comprising a film formation step of forming a SiC epitaxial layer on one surface of a SiC substrate, wherein a growth rate of the SiC epitaxial layer is 61 μm/h or more, a film formation temperature for an inner region of the SiC epitaxial layer in the film formation step is lower than ±1° C. with respect to an average temperature in the inner region, a film formation temperature for an outer region of the SiC epitaxial layer in the film formation step is lower than a temperature of an outermost circumference of the inner region by equal to or higher than 2° C. and lower than 10° C., the inner region is a region on an inner side of a concentric circle having a center position coinciding with a center of the SiC substrate and having a diameter that is 80% of a diameter of the SiC substrate, and the outer region is a region on an outer side of the inner region.

5. The method for manufacturing a SiC epitaxial wafer according to claim 4, wherein the diameter of the SiC substrate is 149 mm or more.

6. The method for manufacturing a SiC epitaxial wafer according to claim 4, wherein the diameter of the SiC substrate is 199 mm or more.

7. The SiC epitaxial wafer according to claim 1, wherein a carrier concentration uniformity of the SiC epitaxial layer is 3.0% or less.

8. The SiC epitaxial wafer according to claim 1, wherein a carrier concentration uniformity of the SiC epitaxial layer is 2.4% or less.

9. The SiC epitaxial wafer according to claim 1, wherein a carrier concentration uniformity of the SiC epitaxial layer is 1.0% or less.

10. The SiC epitaxial wafer according to claim 1, wherein the SiC epitaxial layer contain boron or aluminum, the carrier concentrations of boron and aluminum are each be $1.0 \times 10^{14}$ cm$^{-3}$ or less at all measurement points as in the case of the carrier concentration.

11. The method for manufacturing a SiC epitaxial wafer according to claim 4, wherein the film formation temperature for the outer region of the SiC epitaxial layer in the film formation step is lower than the temperature of an outermost circumference of the inner region by equal to or higher than 4° C.

* * * * *